US012610746B2

(12) United States Patent
Lee et al.

(10) Patent No.: US 12,610,746 B2
(45) Date of Patent: Apr. 21, 2026

(54) PIEZOELECTRIC SINGLE CRYSTAL-POLYCRYSTALLINE CERAMIC COMPOSITE, PREPARATION METHOD THEREFOR, AND PIEZOELECTRIC AND DIELECTRIC APPLICATION COMPONENTS USING SAME

(71) Applicant: CERACOMP CO., LTD., Asan-si (KR)

(72) Inventors: Ho Yong Lee, Seoul (KR); Won Sun Baick, Seoul (KR); Dong Ho Kim, Seoul (KR); Hyun Jae Joo, Incheon (KR)

(73) Assignee: CERACOMP CO., LTD., Asan-si (KR)

( * ) Notice: Subject to any disclaimer, the term of this patent is extended or adjusted under 35 U.S.C. 154(b) by 401 days.

(21) Appl. No.: 18/007,965

(22) PCT Filed: Dec. 8, 2021

(86) PCT No.: PCT/KR2021/018538
§ 371 (c)(1),
(2) Date: Dec. 2, 2022

(87) PCT Pub. No.: WO2022/124793
PCT Pub. Date: Jun. 16, 2022

(65) Prior Publication Data
US 2023/0247908 A1    Aug. 3, 2023

(30) Foreign Application Priority Data

Dec. 11, 2020    (KR) ........................ 10-2020-0173799
Dec. 3, 2021    (KR) ........................ 10-2021-0171668

(51) Int. Cl.
| | |
|---|---|
| *H10N 30/097* | (2023.01) |
| *C04B 35/468* | (2006.01) |
| *C04B 35/488* | (2006.01) |
| *C04B 35/626* | (2006.01) |
| *C04B 35/64* | (2006.01) |
| *H10N 30/092* | (2023.01) |

(Continued)

(52) U.S. Cl.
CPC ......... *H10N 30/852* (2023.02); *C04B 35/488* (2013.01); *C04B 35/6261* (2013.01); *C04B 35/64* (2013.01); *H10N 30/092* (2023.02); *C04B 2235/3206* (2013.01); *C04B 2235/3249* (2013.01); *C04B 2235/6562* (2013.01); *C04B 2235/6567* (2013.01); *C04B 2235/768* (2013.01); *C04B 2235/783* (2013.01); *C04B 2235/786* (2013.01); *C04B 2235/9607* (2013.01)

(58) Field of Classification Search
CPC ............. H10N 30/852; H10N 30/8536; H10N 30/8554; H10N 30/092; H10N 30/097; H10N 30/853; C04B 35/488; C04B 35/6261; C04B 35/64; C04B 35/4686; C04B 35/472; C04B 2235/3249; C04B 2235/6567; C04B 2235/768; C04B 2235/783; C04B 2235/786; C04B 2235/3274; C04B 2235/78; C04B 2235/3244; H01L 21/02197; H01L 21/31691; H01L 41/09
See application file for complete search history.

(56) References Cited

U.S. PATENT DOCUMENTS

| | | |
|---|---|---|
| 2004/0139911 A1 | 7/2004 | Chiang et al. |
| 2013/0020525 A1 | 1/2013 | Saito et al. |
| 2014/0295138 A1 | 10/2014 | Yan et al. |

FOREIGN PATENT DOCUMENTS

| | | |
|---|---|---|
| JP | 2004352532 A | 12/2004 |
| JP | 2010235442 A | 10/2010 |
| KR | 100564092 | 3/2006 |

(Continued)

OTHER PUBLICATIONS

Machine translation of KR20130064611A, 36 pages. (Year: 2013).*

(Continued)

*Primary Examiner* — Matthew E. Hoban
*Assistant Examiner* — Lynne Edmondson
(74) *Attorney, Agent, or Firm* — CANTOR COLBURN LLP

(57) ABSTRACT

Provided is a piezoelectric single crystal-polycrystal ceramic composite, a method of manufacturing the same, and piezoelectric and dielectric application components using the piezoelectric single crystal-polycrystal ceramic composite. The piezoelectric single crystal-polycrystal ceramic composite shows that complexation is carried out by the optimization of a ratio between grain size distributions of a piezoelectric single crystal and polycrystal ceramic grains, and a volume ratio of the contained piezoelectric single crystal so that mass production simultaneously with excellent piezoelectric characteristics of the piezoelectric single crystal can be realized, and the cost of production can be reduced, so the piezoelectric single crystal-polycrystal ceramic composite can be applied to piezoelectric and dielectric application components, like ultrasonic transducers, piezoelectric actuators, piezoelectric sensors, dielectric capacitors, electric field-generating transducers, and electric field and vibration-generating transducers, using the piezoelectric single crystal-polycrystal ceramic composite, and the piezoelectric single crystal-polycrystal ceramic composite can enhance piezoelectric characteristics and competitiveness in prices.

19 Claims, 5 Drawing Sheets

(51) Int. Cl.
    H10N 30/85      (2023.01)
    H10N 30/853    (2023.01)

(56)            References Cited

FOREIGN PATENT DOCUMENTS

| | | |
|---|---|---|
| KR | 100743614 | 7/2007 |
| KR | 20130064611 | 6/2013 |
| KR | 101536973 | 7/2015 |

OTHER PUBLICATIONS

Guo et al., High-Performance Sm-Doped Pb(Mg1/3Nb2/3)O3—PbZrO3-PbTiO3-Based Piezoceramics, ACS Applied Materials & Interfaces, 2019, vol. 11, pp. 43359-43367.

Park et al., Characteristics of Relaxor-Based Piezoelectric Single Crystals for Ultrasonic Transducers, IEEE Transactions on Ultrasonics, Ferroelectrics, and Frequency Control, vol. 44, No. 5, Sep. 1997, pp. 1140-1147.

International Search Report—PCT/KR2021/018538 dated Apr. 4, 2022.

* cited by examiner

PIEZOELECTRIC SINGLE CRYSTAL-POLYCRYSTALLINE CERAMIC COMPOSITE, PREPARATION METHOD THEREFOR, AND PIEZOELECTRIC AND DIELECTRIC APPLICATION COMPONENTS USING SAME

TECHNICAL FIELD

The present invention relates to a piezoelectric single crystal-polycrystalline ceramic composite, a method of manufacturing the same, and piezoelectric and dielectric parts using the same, and more particularly, to a piezoelectric single crystal-polycrystalline ceramic composite comprising a mixture of a piezoelectric single crystal having a high piezoelectric charge constant $d_{33}$ and a low dielectric loss tan δ, and polycrystal ceramic grains, and which can be manufactured in such a manner that complexation is carried out by the optimization of grain size distributions and a volume ratio of the contained piezoelectric single crystal so that a high piezoelectric characteristic of the piezoelectric single crystal can be maintained, and a mechanical brittleness characteristic can be improved, and the cost of production can be reduced owing to simplifying process.

BACKGROUND ART

Since piezoelectric single crystals having a perovskite type crystal structure ($[A][B]O_3$) show a dielectric constant $K_3^T$, a piezoelectric charge constants $d_{33}$, and an electromechanical coupling coefficient $k_{33}$ which are incredibly high beyond those shown in existing piezoelectric polycrystal materials, it is expected that the piezoelectric single crystals will be used in high-performance components, like piezoelectric actuators, ultrasonic transducers, piezoelectric sensors, dielectric capacitors, and so on, and their practical application will also lead them to various kinds of substrate materials for thin film elements.

Examples of piezoelectric single crystals having a perovskite type crystal structure which have been developed until today include PMN-PT ($Pb(Mg_{1/3}Nb_{2/3})O_3$—$PbTiO_3$), PZN-PT ($Pb(Zn_{1/3}Nb_{2/3})O_3$—$PbTiO_3$), PInN-PT ($Pb(In_{1/2}Nb_{1/2})O_3$—$PbTiO_3$), PYbN-PT ($Pb(Yb_{1/2}Nb_{1/2})O_3$—$PbTiO_3$), PSN-PT ($Pb(Sc_{1/2}Nb_{1/2})O_3$—$PbTiO_3$), BiScO_3—$PbTiO_3$ (BS-PT), PMN-PInN-PT, PMN-PYbN-PT, and so on. Since these single crystals show a congruent melting behavior at the time of melting, they have usually been manufactured by a flux method, a Bridgman method, and so on that are existing single crystal growth methods.

However, although the piezoelectric single crystals of PMN-PT and PZN-PT developed before have the advantage of showing high dielectric and piezoelectric characteristics ($K_3^T$>4,000, $d_{33}$>1,400 pC/N, and $k_{33}$>0.85) at the room temperature, they are considerably restricted in their utilization due to defects, like low phase transition temperatures $T_C$ and $T_{RT}$, a low coercive electric field $E_C$, brittleness, a high production cost, and so on.

In general, piezoelectric single crystals having a perovskite type crystal structure have been known as showing the highest dielectric and piezoelectric characteristics from a neighboring boundary with respect to composition in a morphotropic phase boundary (i.e., MPB) between a rhombohedral phase and a tetragonal phase. A piezoelectric single crystal in tetragonal series has been known as being useful in some specific crystal directions of showing excellent piezoelectric, or electrical and optical characteristics.

However, since the piezoelectric single crystals having the perovskite type crystal structure generally show the best excellent dielectric and piezoelectric characteristics when they have a rhombohedral phase, practical application of the piezoelectric single crystals in the rhombohedral phase has been carried out most actively, but since the piezoelectric single crystals in the rhombohedral phase are stable only at a phase transition temperature $T_{RT}$ or below between the rhombohedral phase and a tetragonal phase, they can be used only at the phase transition temperature TRT or below, the greatest temperature at which the rhombohedral phase is stable. Accordingly, in case that the phase transition temperature $T_{RT}$ is low, a workable temperature for the piezoelectric single crystals in the rhombohedral phase gets low, and a temperature required for manufacturing components to which the piezoelectric single crystals are applied, and a workable temperature for the application components are also limited to the phase transition temperature TRT or below:

Also, in case that phase transition temperatures $T_C$ and $T_{RT}$, and a coercive electric field EC are low; depoling easily occurs from the piezoelectric single crystals under the conditions of mechanical processing, stress, heat generation, and driving voltage, and the loss of excellent dielectric and piezoelectric characteristics occurs. Accordingly, the piezoelectric single crystals, which show that phase transition temperatures $T_C$ and $T_{RT}$, and a coercive electric field $E_C$ are low; are restricted in a manufacturing condition of components to which the single crystals are applied, a condition of workable temperatures, a condition of driving voltage, and so on. In case of the PMN-PT single crystal, a curie temperature $T_C$, a phase transition temperature $T_{RT}$, and a coercive electric field $E_C$ generally satisfy $T_C$<150° C., $T_{RT}$<80° C., and $E_C$<2.5 kV/cm, respectively, and in case of the PZN-PT single crystal, a curie temperature $T_C$, a phase transition temperature $T_{RT}$, and a coercive electric field $E_C$ generally satisfy $T_C$<170° C., $T_{RT}$<100° C., and $E_C$<3.5 kV/cm, respectively. Furthermore, since dielectric and piezoelectric components manufactured using these piezoelectric single crystals are also restricted in a manufacturing condition, a condition of workable temperature ranges or operational voltage, and so on, this has been an obstacle to the development and the practical use of components to which the piezoelectric single crystals are applied.

In order to overcome the weak points of the piezoelectric single crystals, single crystals of novel composition, like PInN-PT, PSN-PT, BS-PT, and so on, have been developed, and various kinds of single crystal composition in a mixed form, like PMN-PInN-PT, PMN-BS-PT, and so on, have also been studied.

However, in case of these single crystals, it is problematic in that a dielectric constant, a piezoelectric charge constant, phase transition temperatures, a coercive electric field, and a mechanical characteristic, and so on couldn't be improved simultaneously, and in case of piezoelectric single crystals of composition including costly elements, like Sc, In, and so on, as main ingredients, it is problematic in that the high cost of production for the single crystals has been an obstacle to practical use of the single crystals.

The reason why piezoelectric single crystals having a perovskite type crystal structure comprising PMN-PT developed until today show a low phase transition temperature may largely be divided into three points: first, a phase transition temperature of a relaxor (PMN, PZN, or the like) which is a main constituent along with PT is low.

Non-Patent Document 1 presents a phase transition temperature TC between a tetragonal phase and a cubical phase of piezoelectric ceramic polycrystals having a perovskite type structure in Table 1. Since a curie temperature of the piezoelectric single crystals are similar to that of the polycrystals of the same composition, the curie temperature of the piezoelectric single crystals can be estimated on the basis of that of the polycrystals.

Second, since a morphotropic phase boundary (MPB) at which a tetragonal phase and a rhombohedral phase form the boundary is inclined smoothly rather than being perpendicular to a temperature axis, it is necessarily required to decrease a curie temperature $T_C$ in order to raise a phase transition temperature $T_{RT}$ between the rhombohedral phase and the tetragonal phase, so it is difficult to simultaneously raise the curie temperature $T_C$, and the phase transition temperature $T_{RT}$ between the rhombohedral phase and the tetragonal phase.

Third, even when the relaxor (PYbN, PInN, $BiScO_3$, or the like) having a relatively high phase transition temperature is mixed into PMN-PT, and so on, the phase transition temperature doesn't increase simply in proportion to composition, or the problem of a decline in dielectric and piezoelectric characteristics occurs.

Furthermore, single crystals in relaxor-PT series presented in Non-Patent Document 1 have been manufactured by a flux method, a Bridgman method, and so on which are existing single crystal growth methods, due to a reason related with a manufacturing process of the single crystals, it is difficult to manufacture large single crystals whose composition is uniform, and due to the high cost of production, and difficulty in mass production, the single crystals have not yet succeeded in their commercialization.

Also, in general, since piezoelectric ceramic single crystals have low mechanical strength and low fracture toughness compared with those shown in piezoelectric ceramic polycrystals (polycrystalline ceramics), it is defective in that they are easy to break even due to a small mechanical impact. Brittleness of these piezoelectric single crystals easily gives rise to fracture of the piezoelectric single crystals during manufacturing of applied components using the piezoelectric single crystals, and using of the applied components, so it has been a large limit to use of the piezoelectric single crystals. Accordingly, it is necessary for the commercialization of piezoelectric single crystals to improve a mechanical characteristic simultaneously with improving dielectric and piezoelectric characteristics of the piezoelectric single crystals.

On the contrary, Patent Document 1 discloses an invention relating to a solid-state single crystal growth (SSCG) method, and unlike a conventional liquid-state single crystal growth method, this method doesn't comprise a melting process, but comprises controlling the growth of abnormal grains occurring from a polycrystal through a general heat treatment process without a special device so that single crystals based on various kinds of composition can be manufactured by the solid-state single crystal growth method, and accordingly, the document presents the single crystal growth method that is able to lower the cost of production, and enables mass production of the single crystals through high reproducibility and an economical method.

Also, Patent Document 2 discloses a piezoelectric single crystal having improved mechanical properties simultaneously with a high dielectric constant K3T, high piezoelectric constants das and $k_{33}$, a high phase transition temperature (a curie temperature $T_C$), and a high coercive electric field $E_C$, and with respect to the piezoelectric single crystal manufactured by a solid-state single crystal growth method appropriate for mass production, the development of composition of the single crystal in which expensive raw materials are not included enables commercialization of the single crystal.

However, generally, as compared with piezoelectric polycrystalline ceramic, although piezoelectric single crystals show a high piezoelectric charge constant, depoling easily occurs due to a low coercive electric field, so the piezoelectric single crystals are restricted in their practical use due to low electrical stability. Thus, although a method of enhancing a coercive electric field of piezoelectric single crystals has been suggested, since it is problematic in that an increase in the coercive electric field is attended with a lowering in piezoelectric properties, low effectiveness has been pointed out.

Recently, a research result, a patent, and so on for innovatively increasing a piezoelectric charge constant by changing composition of piezoelectric polycrystalline ceramic (the addition of Sm or the like, and so on) have been announced [Non-Patent Document 2].

Although this case succeeded in raising a piezoelectric charge constant da of the piezoelectric polycrystalline ceramic into a range of 1,000 pC/N or more, since a phase transition temperature or a curie temperature $T_C$ between ferroelectric phases (a rhombohedral phase, a tetragonal phase, and so on) decreased largely, and a dielectric loss tan $\delta$ increased largely, there has still been a large limit to applying the piezoelectric polycrystalline ceramic to a general piezoelectric application field. Accordingly, in order to enable practical application, it has necessarily been required to develop piezoelectric ceramic having a high phase transition temperature, and a low dielectric loss tan $\delta$ simultaneously with having a high piezoelectric charge constant.

However, general piezoelectric polycrystalline ceramic doesn't show high piezoelectric properties unlike those shown in a piezoelectric single crystal because matrix phase grains in the ceramic are arranged in a disorder direction.

In order to solve this problem, a crystal orientation growth (templated grain growth) process intended for arranging grains from polycrystalline ceramic in a specific direction has ever been presented, and according to the existing crystal orientation growth (templated grain growth) process, the ceramic, which is crystal-oriented through a process of arranging a seed single crystal having a specific shape (e.g., a thin disk shape) in a specific direction inside of a polycrystal, and a heat treatment process of growing the seed single crystal in the specific direction, is manufactured. In this case, the seed single crystal remains in the inside of the grains which are grown and crystal-oriented, or the seed single crystal is removed by a reaction.

In case of the crystal orientation ceramic manufactured by the crystal orientation growth process, the ceramic was confirmed to show a high piezoelectric property relatively to that of general polycrystalline ceramic. However, a process cost required for manufacturing the seed single crystal having an appropriate specific shape to the crystal orientation growth process is very high, and as a result, it is difficult to commercialize the crystal orientation ceramic due to its high production cost, and difficulty in its mass production.

Accordingly, it has been required to develop a process which enables a decrease in the cost of production, and mass production by simplifying a manufacturing process without using a seed single crystal having a specific shape, and an arrangement process for the seed single crystal.

Thus, as a result of the present inventors' efforts for improving the conventional problems, the present invention provide a piezoelectric single crystal-polycrystalline ceramic composite which can be manufactured in such a manner that a piezoelectric single crystal, which is restricted in various kinds of application due to difficulty in mass production, and a high production process cost in spite of its excellent piezoelectric characteristic, is mixed with polycrystalline ceramic grains, wherein a grain size distribution between the piezoelectric single crystal and the polycrystalline ceramic grains, and a volume ratio of the piezoelectric single crystal contained are optimized so that high piezoelectric characteristics of the piezoelectric single crystal can be maintained, and the production process is simplified so that a mechanical characteristic of brittleness control can be improved, and at the same time as this, mass production can be realized, and the present invention has been completed in such a manner as to confirm physical properties of the piezoelectric single crystal-poly crystalline ceramic composite.

Patent Document 1: Korean Patent No. 0564092 (officially announced on Mar. 27, 2006)

Patent Document 2: Korean Patent No. 0743614 (officially announced on Jul. 30, 2007)

(Non-Patent Document 1): IEEE Transactions on Ultrasonics, Ferroelectrics, and Frequency Control, vol. 44, no. 5, 1997, pp. 1140-1147.

(Non-Patent Document 2): Appl. Mater. Interfaces 2019, 11, 46, 43359-43367 High-Performance Sm-Doped Pb(Mg 1/3Nb 2/3)O 3-PbZrO 3-PbTiO 3-Based Piezo-ceramics.

DETAILED DESCRIPTION OF THE INVENTION

Technical Problem

An object of the present invention is to provide a piezoelectric single crystal-polycrystalline ceramic composite.

Another object of the present invention is to provide a method of manufacturing a piezoelectric single crystal-polycrystalline ceramic composite.

The other object of the present invention is to provide a piezoelectric application component and a dielectric application component using a piezoelectric single crystal-polycrystalline ceramic composite.

Solution for Solving the Problem

A method of manufacturing according to the present invention comprises.

In order to accomplish the objects as described above, the present invention provides a piezoelectric single crystal-polycrystalline ceramic composite comprising a mixture of a piezoelectric single crystal having a perovskite type structure ($[A][B]O_3$), and polycrystalline ceramic grains, the composite satisfying the following: an average grain size distribution a of the piezoelectric single crystal is 100 to 1,000 μm; an average grain size distribution b of the polycrystalline ceramic grains is 2 to 20 μm; and a ratio a/b between the grain size distributions is 20 to 100.

With respect to the piezoelectric single crystal-polycrystalline ceramic composite, it is preferable that the piezoelectric single crystal is contained in a range of 30 to 80 vol %, and the piezoelectric single crystal grains inside of the composite are oriented into a specific crystal direction. Preferably, the specific crystal direction of the piezoelectric single crystal is a direction oriented to <001> or <011>.

The piezoelectric single crystal-polycrystalline ceramic composite resulting from carrying out complexation according to optimization of the grain size distributions between the piezoelectric single crystal and the polycrystalline ceramic grains, and the volume ratio of the contained piezoelectric single crystal has, under a condition of the room temperature, (1) a dielectric constant $K_3^T$ of 3,000 or more, (2) a piezoelectric charge constant $d_{33}$ of 1,200 pC/N or more, and (3) a first phase transition temperature of 80° C. or more, and causes a mechanical characteristic of brittleness control to be improved as well as maintaining a high piezoelectric characteristic of the piezoelectric single crystal.

The piezoelectric single crystal-polycrystalline ceramic composite of the present invention has a phase transition between ferroelectric phases (a rhombohedral phase, a tetragonal phase, and so on) at a curie temperature $T_C$ or below; and a dielectric constant $K_3^T$ of the piezoelectric single crystal-polycrystalline ceramic composite at the phase transition temperature between the ferroelectric phases is more than three times higher than the $K_3^T$ at the room temperature.

Also, The composite has a ratio [$d_{33}$/tan δ] of 1,000 or more, where $d_{33}$ (pC/N) is a piezoelectric charge constant and tan δ (%) is the dielectric loss at room temperature and the composite has a ratio [($d_{33} \times g_{33}$)/tan δ] of 25,000 or more, where $d_{33}$ (pC/N) is the piezoelectric charge constant, $g_{33}$ ($10^{-3}$ Vm/N) is a piezoelectric voltage constant, and tan δ (%) is the dielectric loss at room temperature.

With respect to the piezoelectric single crystal-polycrystalline ceramic composite of the present invention, the piezoelectric single crystal is a piezoelectric single crystal having a perovskite type structure ($[A][B]O_3$), preferably, a piezoelectric single crystal expressed by Chemical Formula 1 below:

$$[A_{1-(a+1.5b)}B_aC_b][(MN)_{1-x-y}(L)_yTi_x]O_{3-z} \qquad \text{Chemical Formula 1}$$

in said formula, A represents Pb or Ba,

B represents at least one or more elements selected from a group consisting of Ba, Ca, Co, Fe, Ni, Sn, and Sr, C represents one or more elements selected from a group consisting of Co, Fe, Bi, La, Ce, Pr, Nd, Pm, Sm, Eu, Gd, Tb, Dy, Ho, Er, Tm, Yb, and Lu, L represents a single form composed of one selected from Zr or Hf, or a mixed form thereof, M represents at least one or more element selected from a group consisting of Ce, Co, Fe, In, Mg, Mn, Ni, Sc, Yb, and Zn, N represents at least one or more elements selected from a group consisting of Nb, Sb, Ta, and W, and a, b, x, y, and z represent $0<a\leq0.10$, $0<b\leq0.05$, $0.05\leq x\leq0.58$, $0.05\leq y\leq0.62$, and $0\leq z\leq0.02$, respectively.

With respect to the piezoelectric single crystal expressed by Chemical Formula 1, it is preferable that a porosity inside of the single crystal is 0.5 vol % or more.

With respect to the piezoelectric single crystal expressed by Chemical Formula 1, composition satisfies $0.01\leq a\leq0.10$ and $0.01\leq b\leq0.05$, and more preferably, satisfying a/b≥2 in said formula.

With respect to the piezoelectric single crystal expressed by Chemical Formula 1, it is more preferable that $0.10\leq x\leq0.58$ and $0.10\leq y\leq0.62$ are satisfied.

When L represents the mixture of Zr and Hf, the piezoelectric single crystal is expressed by Chemical Formula 2 below $$[A_{1-(a+1.5b)}B_aC_b][(MN)_{1-x-y}(Zr_{1-w}Hf_w)_yTi_x]O_3 \qquad \text{Chemical Formula 2}$$

in said formulae, A, B, C, M, N, a, b, x, y, and z are identical with those shown in said Chemical Formula 1, and w represents $0.01\leq w\leq0.20$.

At this time, the piezoelectric single crystal satisfies that a curie temperature $T_C$ is 180° C. or more, a phase transition temperature between a rhombohedral phase and a tetragonal phase $T_{RT}$ is 100° C. or more, a longitudinal electromechanical coupling coefficient $k_{33}$ is 0.85 or more, and a coercive electric field $E_C$ is 4 to 12 kV/cm.

In particular, the piezoelectric single crystal satisfies that a dielectric constant $K_3^T$ is 4,000 or more, preferably, 4,000 to 15,000, and a piezoelectric charge constant $d_{33}$ is 1,400 or more, preferably, 1,400 to 6,000 pC/N.

The present invention provides a method of manufacturing the piezoelectric single crystal-polycrystalline ceramic composite, the method comprising:

preparing single crystal grains a by crushing a piezoelectric single crystal having a perovskite type structure ([A][B]$O_3$) in 50 μm or more;

preparing polycrystal powder grains b having an average grain size distribution of 0.1 to 5 μm, thereby carrying out mixing and heat treatment so that a grain size distribution a/b reaches 20 or more; and growing the piezoelectric single crystal through the heat treatment so that a grain size of the piezoelectric single crystal reaches 100 μm or more, wherein a ratio between the grain size distributions a/b after the heat treatment reaches 20 to 100.

The piezoelectric single crystal is contained in a range of 80 vol % or below at the time of said mixing before the heat treatment, and after the heat treatment, the piezoelectric single crystal is contained in a range of 30 to 80 vol %.

Also, the method shows manufacturing the piezoelectric single crystal-polycrystalline ceramic composite which satisfies the following requisites: an average grain size distribution a of the piezoelectric single crystal grown after the heat treatment is 100 μm or more, more preferably, 100 to 1,000 μm; an average grain size distribution b of the polycrystalline grains grown after the heat treatment is 2 to 20 μm; and a ratio a/b between the grain size distributions is 20 to 100.

At this time, it is preferable that the heat treatment is carried out at a heating rate of 1 to 20° C./min.

Furthermore, the present invention provides a piezoelectric application component and a dielectric application component comprising the piezoelectric single crystal-polycrystalline ceramic composite.

Specifically, any one selected from a group consisting of ultrasonic transducers, piezoelectric actuators, piezoelectric sensors, dielectric capacitors, electric field-generating transducers, and electric field and vibration-generating transducers comprising the piezoelectric single crystal-polycrystalline ceramic composite may be applied to the piezoelectric application component and the dielectric application component.

Effect of the Invention

With respect to a piezoelectric single crystal-polycrystalline ceramic composite according to the present invention, since dielectric characteristics of a piezoelectric single crystal having a dielectric constant ($K_3^T \geq 4,000$), and a piezoelectric charge constant ($d_{33} \geq 1,400$ pC/N) are maintained without being controlled inside of the composite, a dielectric constant and a piezoelectric charge constant ($d_{33} \geq 1,200$ pC/N) of the piezoelectric single crystal-polycrystalline ceramic composite of the present invention are maintained in a state of being high, and mass production can be realized at low process costs.

Since a piezoelectric single crystal-polycrystalline ceramic composite according to the present invention enables mass production at low costs while having excellent piezoelectric characteristics, it can satisfy requirements for performance of a piezoelectric application component and a dielectric application component using the piezoelectric single crystal-polycrystalline ceramic composite, and competitiveness in prices.

BEST MODE FOR CARRYING OUT THE INVENTION

Figure 1:
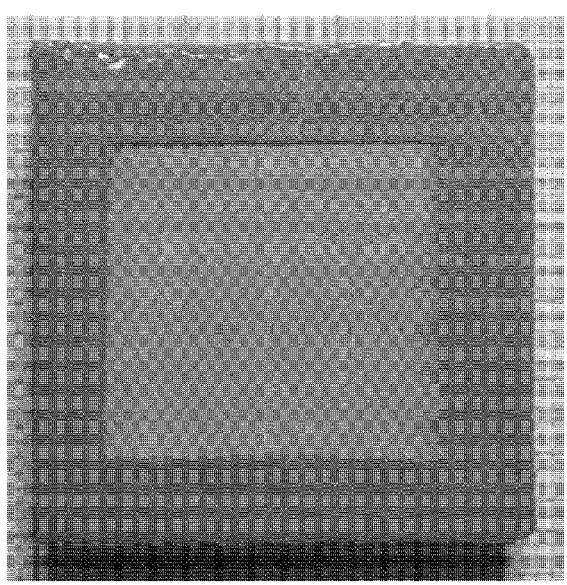
FIG. 1 shows a piezoelectric single crystal of $[Pb_{0.965}Sr_{0.02}La_{0.01}][(Mg_{1/3}Nb_{2/3})_{0.4}Zr_{0.25}Ti_{0.35}]O_3$ which is included in a piezoelectric single crystal-polycrystalline ceramic composite according to Example 1 of the present invention.

Hereinafter, the present invention is described in detail.

The present invention relates to a composite comprising a mixture of a piezoelectric single crystal having a perovskite type structure ([A][B]$O_3$), and polycrystalline ceramic grains, and shows that (1) when a difference in sizes among the piezoelectric single crystal and the polycrystalline ceramic grains is specified at the optimum ratio, an excellent piezoelectric characteristic of the piezoelectric single crystal is maintained, and (2) a difference in composition between the piezoelectric single crystal and the polycrystalline ceramic grains is optimized so that piezoelectric and mechanical characteristics of the composite can be improved.

More specifically, the piezoelectric single crystal-polycrystalline ceramic composite of the present invention shows that an average grain size distribution of the piezoelectric single crystal a is 100 to 1,000 μm, an average grain size distribution of the polycrystalline ceramic grains b is 2 to 20 μm, and a ratio between the grain size distributions a/b is 20 to 100.

Also, a volume ratio between the piezoelectric single crystal and the polycrystalline ceramic grains is optimized so that the piezoelectric single crystal is contained in a range of 30 to 80 vol % in the piezoelectric single crystal-polycrystalline ceramic composite.

In general, in case of a composite in which a piezoelectric single crystal having a high piezoelectric charge constant ($d_{33} \geq 1,400$ pC/N) is mixed with polycrystalline ceramic grains, the piezoelectric charge constant ($d_{33} \leq 1,000$ pC/N) tends to decrease remarkably, and the composite in such a level is low in value in the light of practical application.

On the contrary, the present invention may provide a piezoelectric crystal-polycrystalline ceramic composite which can be manufactured in such a manner as to optimize (1) a ratio between the grain size distributions of the piezoelectric single crystal and the polycrystalline ceramic grains, and (2) a volume ratio of the piezoelectric single crystal contained, thereby maintaining a high piezoelectric characteristic of the piezoelectric single crystal (a piezoelectric charge constant, $d_{33} \geq 1,200$ pC/N), and simplifying a production process in order to enable mass production simultaneously with improving a mechanical characteristic of brittleness control.

Although the piezoelectric single crystal is not specially restricted in a shape, in order to enhance total density of the composite by raising a packing factor (packing density) within the matrix phase, it is preferable that the piezoelectric single crystal has an isotropic shape, like a globular shape, a regular hexahedron shape, and so on.

Also, although the piezoelectric single crystal inside of the composite may be arranged in a chaotic direction, preferably, in a case that the piezoelectric single crystal is oriented in a specific crystal direction, this may bring about more improvement on the piezoelectric characteristic. At this time, the specific crystal direction of the piezoelectric single crystal is a direction oriented to <001> or <011>.

With respect to the piezoelectric single crystal of the present invention, unlike an existing process for crystal orientation growth (templated grain growth), no process of growing the piezoelectric single crystal using a specific seed single crystal inside of a matrix phase is carried out, so a seed single crystal used in single crystal growth, or a seed single crystal removed after single crystal growth is not included inside of the piezoelectric single crystal of the present invention.

Accordingly, since no process cost for manufacturing a specific seed single crystal is required, the manufacturing process is simplified so that the cost of production can get low, and mass production can be realized.

However, although there is a case in which the piezoelectric single crystal grows partially during a process of mixing the piezoelectric single crystal and the polycrystalline ceramic grains grown in the outside, and sintering the composite, this is not necessarily required unlike being required in an existing crystal orientation growth (i.e., templated grain growth) process.

The aforesaid piezoelectric single crystal-polycrystalline ceramic composite in which (1) the ratio between the grain size distributions of the piezoelectric single crystal and the polycrystalline ceramic grains, and (2) the volume ratio of the piezoelectric single crystal contained are optimized realizes the following features:

①ⓐ a dielectric constant $K_3^T$ at the room temperature is 3,000 or more;

②ⓐ a piezoelectric charge constant $d_{33}$ at the room temperature is 1,200 pC/N or more; and ③ⓐ a phase transition temperature which is first shown at the room temperature is 80° C. or more.

The room temperature described above means that evaluation on physical properties are carried out under a condition of the same temperature in a temperature range of the room temperature, and unless the context in the specification of the present invention indicates otherwise, the room temperature means that the evaluation is carried out at 30° C. of the temperature.

More specifically, the piezoelectric single crystal-polycrystalline ceramic composite shows a phase transition phenomenon occurring between ferroelectric phases (a rhombohedral phase, a tetragonal phase, and so on) at a curie temperature $T_E$ or below. Preferably, the dielectric constant $K_3^T$ of the piezoelectric single crystal is characteristic in that the dielectric constant at a phase transition temperature between the ferroelectric phases is higher than that at the curie temperature $T_C$.

More preferably, the dielectric constant $K_3^T$ of the piezoelectric single crystal-polycrystalline ceramic composite at the phase transition temperature between the ferroelectric phases is more than three times higher than the $K_3^T$ at the room temperature.

Also, in general, the piezoelectric single crystal is characteristic in that the piezoelectric charge constant d33 is high, and a dielectric loss tan δ is low. On the contrary, in case of the piezoelectric polycrystalline ceramic, since it is characteristic in that the piezoelectric charge constant $d_{33}$ and the dielectric loss tan δ increase simultaneously, it is difficult to develop polycrystalline piezoelectric ceramic having a low dielectric loss tan δ as well as a high piezoelectric charge constant.

Thus, the present invention is characteristic in that characteristics of the piezoelectric single crystal having a high piezoelectric charge constant $d_{33}$ and a low dielectric loss tan δ are maximized so that a piezoelectric charge constant $d_{33}$ of the composite is maximized, and a dielectric loss tan δ of the composite is minimized, and as a result, a ratio [$d_{33}$/tan δ] between the piezoelectric charge constant $d_{33}$ (pC/N) and the dielectric loss tan δ (%) is maximized into 1,000 or more.

Also, simultaneously with the characteristic, the piezoelectric single crystal-polycrystalline ceramic composite of the present invention is characteristic in that since an increase range of the dielectric constant is small, a ratio [$(d_{33} \times g_{33})$/tan δ] between a value resulting from multiplying the piezoelectric charge constant $d_{33}$ (pC/N) by a piezoelectric voltage constant $g_{33}$ (10-3 Vm/N), and the dielectric loss tan δ is maximized into 25,000 or more.

Also, with respect to the piezoelectric single crystal-polycrystalline ceramic composite of the present invention, the composite may further comprise a vacant space inside of the composite that is partially or completely filled with a polymer. In this case, a flexible matrix material, like a polymer, epoxy, and so on, inside of the composite enables molding of the composite at a low temperature, and provides the composite with flexibility.

The piezoelectric single crystal used in the piezoelectric single crystal-polycrystalline ceramic composite of the present invention is characteristic in the light of a high dielectric constant ($K_3^T \geq 4,000$), a high piezoelectric charge constant ($d_{33} \geq 1,400$ pC/N), and a high coercive electric field ($E_C \geq 4 \sim 12$ kV/cm).

More specifically, the piezoelectric single crystal used in the present invention is a piezoelectric single crystal having a perovskite type structure ([A][B]O$_3$), and preferably, a piezoelectric single crystal represented by Chemical Formula 1 below:

$$[A_{1-(a+1.5b)}B_aC_b][(MN)_{1-x-y}(L)_yTi_x]O_{3-z} \qquad \text{Chemical Formula 1}$$

in said formula, A represents Pb or Ba,

B represents at least one or more elements selected from a group consisting of Ba, Ca, Co, Fe, Ni, Sn, and Sr, C represents one or more elements selected from a group consisting of Co, Fe, Bi, La, Ce, Pr, Nd, Pm, Sm, Eu, Gd, Tb, Dy, Ho, Er, Tm, Yb, and Lu, L represents a single form composed of one selected from Zr or Hf, or a mixed form thereof, M represents at least one or more element selected from a group consisting of Ce, Co, Fe, In, Mg, Mn, Ni, Sc, Yb, and Zn, N represents at least one or more elements selected from a group consisting of Nb, Sb, Ta, and W, and a, b, x, y, and z represent 0<a≤0.10, 0<b≤0.05, 0.05≤x≤0.58, 0.05≤y≤0.62, and 0≤z≤0.02, respectively.

With respect to the piezoelectric single crystal represented by Chemical Formula 1, it is preferable that a porosity inside of the single crystal is 0.5 vol % or more.

Based on the fact that the piezoelectric single crystal represented by Chemical Formula 1 shows a tendency that the more chemical composition is complicated, the more a piezoelectric characteristic increase, ions located at [A] from the perovskite type crystal structure are formed in complex composition.

At this time, specifically reviewing the complex composition of the ion located at [A] from the piezoelectric single crystal represented by Chemical Formula 1, the complex composition may be configured into [A$_{1-(a+1.5b)}$B$_a$C$_b$], composition of A comprises a flexible or inflexible element, and the examples of the present invention are described based on only piezoelectric single crystals in flexible series in which A represents Pb, but A shouldn't be construed as being limited thereto.

With respect to the ion located at [A], composition of B includes a divalent metal, preferably, at least one or more elements selected from a group consisting of Ba, Ca, Co, Fe, Ni, Sn, and Sr, and a trivalent metal is used in composition of C.

It is preferable to use one or more elements selected from a group consisting of Co, Fe, Bi, La, Ce, Pr, Nd, Pm, Sm, Eu, Gd, Tb, Dy, Ho, Er, Tm, Yb, and Lu, and it is more preferable to use an element in lanthanide series in a single form, or elements in lanthanide series in a form in which two elements are mixed.

In the examples of the present invention, with respect to the ion located at [A], it is described that the composition of C represents single composition including Sm, or composition in which one or more elements are mixed, but it should not be limited thereto.

With respect to the complex composition of the ion located at [A] from the piezoelectric single crystal represented by Chemical Formula 1, the composition of [A$_{1-(a+1.5b)}$B$_a$C$_b$] corresponding to the ion located at [A] is a requisite required for realizing targeted physical properties, and is characteristic in that when A is a piezoelectric single crystal in flexible or inflexible series, it is composed by mixing of a divalent metal and a trivalent metal.

That is, 0.01≤a≤0.10, and 0.01≤b≤0.05 should be satisfied, and more preferably, a/b≥2 should be satisfied. At this time, in the composition, when a is less than 0.01, it is problematic in that a perovskite type phase is unstable, and when a exceeds 0.10, it is not preferable in that it is difficult to put it into practical use because a phase transition temperature gets too low:

Also, if the requisite of a/b≥2 isn't satisfied, it will be not preferable because it is problematic in that dielectric and piezoelectric characteristics are not maximized, or growth of the single crystal is limited.

At this time, with respect to the complex composition concerning the ion located at [A] from the piezoelectric single crystal represented by the compositional formula of Chemical Formula 1, an excellent dielectric constant compared with that shown in case of composition composed of a trivalent metal alone, or a divalent metal alone may be realized in case of the complex composition.

According to a state diagram of [A][MN]O$_3$—PbTiO$_3$—PbZrO$_3$ known generally, it represents a composition area showing excellent dielectric and piezoelectric characteristics from the surroundings of a morphotrophic phase boundary between a rhombohedral phase and a tetragonal phase. According to the state diagram of [A][MN]O$_3$—PbTiO$_3$—PbZrO$_3$, the dielectric and piezoelectric characteristics are maximized from composition in the morphotrophic phase boundary between the rhombohedral phase and the tetragonal phase, and the dielectric and piezoelectric characteristics decrease gradually as composition gradually goes away from the composition in the MPB. Furthermore, in case of within 5 mol % of composition into an area of the rhombohedral phase from the composition in the MPB, since a decrease in the dielectric and piezoelectric characteristics is small, very high values of the dielectric and piezoelectric characteristics are maintained, and in case of within 10 mol % of composition into the area of the rhombohedral phase from the composition in the MPB, the dielectric and piezoelectric characteristics decrease consecutively, but sufficient high dielectric and piezoelectric characteristic values to be applied to dielectric and piezoelectric application components are shown. In case that composition changes to composition into an area of the tetragonal phase from the composition in the MPB, a decrease in the dielectric and piezoelectric characteristics occurs more rapidly than in the area of the rhombohedral phase. However, even in case of within 5 mol % of the composition into the area of the tetragonal phase, or in case of within 10 mol % of the composition, the dielectric and piezoelectric characteristics decrease consecutively, but sufficient high dielectric and piezoelectric characteristic values to be applied to dielectric and piezoelectric application components are shown.

The morphotropic phase boundary (MPB) between PbTiO$_3$ and PbZrO$_3$ has been known as PbTiO$_3$ to PbZrO$_3$=x to y=0.48 to 0.52 (a molar ratio).

In case that composition changes to 5 mol % of the composition into each area of the rhombohedral phase and the tetragonal phase from the composition in the MPB, the maximum values of x and y are 0.53, and 0.57, respectively, (in other words, when x is the largest, x to y represents 0.53 to 0.47, and when y is the largest, x to y represents 0.43 to 0.57). Furthermore, in case that composition changes to 10 mol % of the composition into each area of the rhombohedral phase and the tetragonal phase from the composition in the MPB, the maximum values of x and y are 0.58, and 0.62, respectively, (in other words, when x is the largest, x to y represents 0.58 to 0.42, and when y is the largest, x to y represents 0.38 to 0.62). The high dielectric and piezoelectric characteristic values are maintained in the range of within 5 mol % of the composition into each area of the rhombohedral phase and the tetragonal phase from the composition in the MPB, and the sufficient high dielectric and piezoelectric characteristic values to be applied to dielectric and piezoelectric application components are shown in the range of within 10 mol % of the composition into each area of the rhombohedral phase and the tetragonal phase from the composition in the MPB.

Also, in case that each content of $PbTiO_3$ and $PbZrO_3$, namely, the values of x and y are 0.05 or below; it is not appropriate to the present invention because the morphotropic phase between the rhombohedral phase and the tetragonal phase may not be made, or phase transition temperatures and a coercive electric field are too low.

In said Chemical Formula 1, it is preferable that x belongs into a range of $0.05 \le x \le 0.58$, and more preferably, satisfying $0.10 \le x \le 0.58$. That is because phase transition temperatures $T_C$ and $T_{RT}$ are low; piezoelectric charge constants $d_{33}$ and $k_{33}$ are low; or a coercive electric field $E_C$ is low when x is less than 0.05, and a dielectric constant $K_3{}^T$ is low, piezoelectric charge constants $d_{33}$ and $k_{33}$ are low; or a phase transition temperature $T_{RT}$ is low when x exceeds 0.58. Meanwhile, it is preferable that y belongs into a range of $0.050 << 0.62$, and more preferably, satisfying $0.10 \le y \le 0.62$. The reason is that phase transition temperatures $T_C$ and $T_{RT}$ are low, piezoelectric charge constants $d_{33}$ and $k_{33}$ are low; or a coercive electric field $E_C$ is low when y is less than 0.05, and a dielectric constant $K_3{}^T$ is low; or piezoelectric charge constants $d_{33}$ and $k_{33}$ are low when y exceeds 0.62.

With respect to the piezoelectric single crystal represented by the compositional formula of Chemical Formula 1 according to the present invention, a tetravalent metal is included in the ion located at [B] from the perovskite type crystal structure ([A][B]$O_3$), and in particular, a form in composition of L is limited to a single form composed of one selected from Zr or Hf, or a mixed form thereof.

When L represents the mixed form, a piezoelectric single crystal represented by Chemical Formula 2 is provided:

$$[A_{1-(a+1.5b)}B_aC_b][(MN)_{1-x-y}(Zr_{1-w},Hf_w)_yTi_x]O_3 \quad \text{Chemical Formula 2}$$

in said formulae, A, B, C, M, N, a, b, x, y, and z are the same as those shown in Chemical Formula 1, and w represents $0.01 \le w \le 0.20$.

At this time, when w is less than 0.01, it is problematic in that no dielectric and piezoelectric characteristics are maximized, and when w exceeds 0.20, it is not preferable in that dielectric and piezoelectric characteristics decrease suddenly.

The piezoelectric single crystals represented by the compositional formulae of said Chemical Formula 1 to said Chemical Formula 3 are piezoelectric single crystals in which complex composition of the ion located at [A], and composition of the ion located at [B] from the perovskite type crystal structure ([A][B]$O_3$) are mixed so that a curie temperature TC is 180° C. or more, and at the same time as this, a phase transition temperature $T_{RT}$ between a rhombohedral phase and a tetragonal phase is 100° C. or more. At this time, when the curie temperature is less than 180° C., this is problematic in that it is difficult to raise a coercive electric field $E_C$ up to 5 kV/cm or more, or the phase transition temperature $T_{RT}$ up to 100° C. or more.

Also, the piezoelectric single crystal represented by the compositional formula of Chemical Formula 1 is characteristic in that oxygen vacancy located at [O] from the perovskite type crystal structure ([A][B]$O_3$) is controlled based on the requisite of $0 \le z \le 0.02$. At this time, when said z exceeds 0.02, this is preferable because it is problematic in that the dielectric and piezoelectric characteristics decrease suddenly.

When the oxygen vacancy is induced into the range, a coercive electric field and an internal electric field increase effectively, so stability of the piezoelectric single crystal increases at the time of driving of the electric field, and under a condition of mechanical load. Accordingly, the piezoelectric characteristics are maximized, and at the same time as this, stability is also able to be enhanced.

The piezoelectric single crystal represented by Chemical Formula 1 according to the present invention shows that an electromechanical coupling coefficient $k_{33}$ is 0.85 or more, and when the electromechanical coupling coefficient is less than 0.85, this is not preferable in that a characteristic shown in the piezoelectric single crystal is similar to that shown in piezoelectric polycrystalline ceramics, and energy conversion efficiency gets low.

With respect to the piezoelectric single crystal according to the present invention, it is preferable that the coercive electric field $E_C$ is 4 to 12 kV/cm, and when the coercive electric field is less than 4 kV/cm, it is problematic in that poling is easily removed at the time of processing of the piezoelectric single crystal, or at the time of manufacturing or using of components to which the piezoelectric single crystal is applied.

Also, the piezoelectric single crystal according to the present invention satisfies a high dielectric constant ($K_3{}^T \ge 4,000\sim15,000$) and a high piezoelectric charge constant ($d_{33} \ge 1,400\sim6,000$ pC/N) simultaneously.

Also, the piezoelectric single crystal represented by the compositional formula of Chemical Formula 1 according to the present invention may be provided in a single crystal having uniformity because a composition gradient inside of the single crystal is formed in a range of 0.2 to 0.5 mol %.

The composition of the piezoelectric single crystal may further comprise 0.1 to 20% of a reinforced second phase P at a volume ratio, and the reinforced second phase P is a metal phase, an oxide phase, or a pore.

More specifically, the reinforced second phase P is at least one or more materials selected from a group consisting of Au, Ag, Ir, Pt, Pd, Rh, MgO, $ZrO_2$, and a pore, and the reinforced second phase P is uniformly distributed in a grain form inside of the piezoelectric single crystal, or it is regularly distributed while having a fixed pattern.

Also, in the piezoelectric single crystal, said x and said y belong into a range of 10 mol % from the composition in the morphotrophic phase boundary (MPB) between the rhombohedral phase and the tetragonal phase, and more preferably, said x and said y belong into a range of within 5 mol % from the composition in the morphotrophic phase boundary (MPB) between the rhombohedral phase and the tetragonal phase.

Since lead zirconate ($PbZrO_3$) has 230° C. of a high phase transition temperature, and is also effective to cause the morphotrophic phase boundary (MPB) to be more perpendicular to a temperature axis, it enables a high phase transition temperature $T_{RT}$ between the rhombohedral phase and the tetragonal phase to be obtained while maintaining a high curie temperature, so composition which causes phase transition temperatures $T_c$ and $T_{RT}$ to be high simultaneously can be developed.

That is because the phase transition temperatures increase in proportion to a content of the lead zirconate even in case that the lead zirconate is mixed into conventional piezoelectric single crystal composition. Accordingly, the piezoelectric single crystal with the perovskite type crystal structure comprising zirconium (Zr) or lead zirconate may overcome problems occurring from existing piezoelectric single crystals.

Also, zirconia ($ZrO_2$) or lead zirconate is used in main ingredients from existing materials for piezoelectric polycrystals, and is able to make the objects of the present invention accomplished without an increase in raw material costs because it is a low-priced raw material.

On the contrary, unlike PMN-PT, PZN-PT, and so on, the perovskite type piezoelectric single crystal comprising lead zirconate doesn't show a congruent melting behavior at the time of melting, but shows an incongruent melting behavior. Accordingly, when piezoelectric single crystal shows the incongruent melting behavior, it is divided into liquid phase zirconia and solid phase zirconia ($ZrO_2$) at the time of melting of a solid phase, and it may not be manufactured by a flux method, Bridgman method, and so on which are general single crystal growth methods using a melting process because solid phase zirconia particles inside of a liquid phase interrupts growth of the single crystal.

Also, it is difficult to manufacture a single crystal comprising a reinforced second phase through the general single crystal growth methods using a melting process, and it has never been reported yet to manufacture the single crystal. That is because a reinforced second phase reacts to a liquid phase due to its chemical instability at a melting temperature or more, and the reinforced second phase is thus removed without being maintained in an individual second phase form. Also, since a separation between the second phase and the liquid phase occurs due to a difference in density between the second phase within the liquid phase, and the liquid phase, it is difficult to manufacture a single crystal comprising the second phase, and it also is impossible to adjust volume fraction, a size, a shape, arrangement, distribution, and so on of the reinforced second phase inside of the single crystal.

Thus, according to the present invention, piezoelectric single crystals comprising a reinforced second phase are manufactured using a solid phase single crystal growth method in which no melting process is used. In the solid phase single crystal growth method, single crystal growth occurs at a melting temperature or below; so a chemical reaction between the reinforced second phase and the single crystal is controlled, and the reinforced second phase becomes to exist stably in an individual form inside of the single crystal.

Also, single crystal growth occurs from a polycrystal comprising the reinforced second phase, and there is no change in the volume fraction, size, shape, arrangement, distribution, and so on of the reinforced second phase during the single crystal growth. Accordingly, when the volume fraction, size, shape, arrangement, distribution, and so on of the reinforced second phase inside of the polycrystal are controlled in a process of making the polycrystal comprising the reinforced second phase, and single crystals are grown, as a result thereof, the single crystals comprising the reinforced second phase in a desired form, namely, reinforced piezoelectric single crystals (second phase-reinforced single crystals) may be manufactured.

Accordingly, when the flux method and the Bridgman method which are conventional single crystal growth methods are used, piezoelectric single crystals may not be manufactured in complex composition with respect to the perovskite type crystal structure ($[A][B]O_3$). In particular, in case of the flux method and the Bridgman method including the melting process, single crystals may be manufactured in such a manner that a composition gradient inside of the single crystals is 1 to 5 mol % or more, whereas in case of the solid phase single crystal growth method according to the present invention, single crystals may be manufactured in uniform composition in which a composition gradient inside of the single crystals is 0.2 to 0.5 mol %.

Accordingly, in the present invention, with respect to the perovskite type crystal structure ($[A][B]O_3$) comprising lead zirconate using the solid phase single crystal growth method, even when mixing of the complex composition of the ion located at [A], and composition of the ion located at [B] forms complicated composition, piezoelectric single crystals grow uniformly, so novel piezoelectric single crystals showing a dielectric constant ($K_3^T \geq 4{,}000$ or more, preferably, 4,000 to 15,000), a piezoelectric charge constant ($d_{33} \geq 1{,}400$ pC/N or more, preferably, 1,400 to 6,000 pC/N), and a high coercive electric field ($E_C \geq 4$ to 12 kV/cm) which are remarkably enhanced in comparison with those shown in conventional piezoelectric single crystals can be provided.

Also, the present invention provides a method of manufacturing the piezoelectric single crystal-polycrystalline ceramic composite, the method comprising: preparing single crystal grains (a) by crushing a single crystal having a perovskite type structure ($[A][B]O_3$) into 50 µm or more: preparing polycrystalline ceramic grains (b) having an average grain size distribution ranging from 0.1 to 5 µm, thereby carrying out mixing and heat treatment so that a ratio between the grain size distributions a/b after the heat treatment reaches 20 or more, wherein the heat treatment causes a grain size of the piezoelectric single crystal to reach 100 µm, and the ratio between the grain size distributions a/b reaches 20 to 100 after the heat treatment.

The method of manufacturing the piezoelectric single crystals according to the present invention is carried out according to a solid phase single crystal growth method [see Patent Documents 1 and 2], and enables mass production at low process prices compared with the flux method and the Bridgman method.

Also, as grain growth from the polycrystalline ceramic is maximized through a sintering process, a grain size increases to be beyond a size ranging from several tens to hundreds of micrometers (in particular, in case that abnormal grain growth is used), and as the sintered polycrystal is crushed, a piezoelectric single crystal or a piezoelectric single crystal aggregate having a size ranging from several tens to hundreds of micrometers can be obtained.

When piezoelectric single crystals are produced by this method, and are sorted and used, the costs of production of the piezoelectric single crystals can be reduced, so the mass production of composites can be performed at lower process costs.

With respect to the method of manufacturing the piezoelectric single crystal-polycrystalline ceramic composite according to the present invention, although excellent characteristics of the composite result from the piezoelectric single crystal, since the polycrystalline ceramic grains also account for 20 to 70 vol % in the composite, it will also be important to select polycrystalline ceramic grains.

At this time, although composition of the polycrystalline ceramic grains mixed with the piezoelectric crystal expressed by Chemical Formula 1 is identical to that expressed by Chemical Formula 1, the polycrystalline ceramic grains are distinguishable from the piezoelectric single crystal according to a difference in each compositional formula. Also, in case that the composition of the piezoelectric single crystal is different from the composition of the polycrystalline ceramic grains, a rising effect resulting from compounding of two kinds of composition may also be expected.

The composition of the polycrystalline ceramic as described above may include publicly-known polycrystalline composition without being limited thereto.

At this time, the polycrystalline ceramic grains are required to have (1) a high piezoelectric characteristic, (2) an excellent sintering characteristic resulting from an increase in density during heat treatment, and (3) a mechanical characteristic of high fracture toughness.

With respect to the manufacturing method of the piezoelectric single crystal-polycrystalline ceramic composite according to the present invention, simultaneously with an increase in size of the piezoelectric single crystal having a perovskite type structure ($[A][B]O_3$) during heat treatment, a size of the polycrystalline ceramic grains also increases, and thus it is preferable that a grain size of the piezoelectric single crystal before the heat treatment is 50 μm or more. At this time, when the grain size of the piezoelectric single crystal is less than 50 μm, since the grains are crushed to be too small, an effect resulting from complexation becomes insignificant.

Also, in case of the polycrystalline ceramic grains, as an initial grain size gets smaller, it is profitable to densification, so the initial grain size is selected in a range of at least 0.1 μm or more, 0.1 to 5 μm, and thus complexation is carried out.

In general, since a ratio (a/b) between grain size distributions after heat treatment decreases compared with that before the heat treatment, when mixing is carried out so that the ratio (a/b) between the grain size distributions before the heat treatment reaches 20 or more, the ratio (a/b) between the grain size distributions after the heat treatment may satisfy a requisite of being 20 to 100.

The heat treatment is carried out so that a grain size of the piezoelectric single crystal whose grains are grown during the heat treatment reaches 100 μm or more, and the ratio (a/b) between the grain size distributions of the piezoelectric single crystal grains a and the poly crystalline ceramic grains b reaches 20 to 100.

Also, since growth of the piezoelectric crystal grains during the heat treatment is carried out in such a manner that the polycrystalline ceramic grains are exhausted, namely, they are included into the single crystal grains, according to the growth of the single crystal grains during the heat treatment, a volume ratio of the single crystal also increases.

Accordingly, it is preferable that an initial input ratio of the piezoelectric single crystal before the heat treatment is fixed to reach 80 vol % or below, and an input ratio of the piezoelectric single crystal after the heat treatment is optimized so as to reach 30 to 80 vol %.

When the piezoelectric single crystal and the polycrystalline ceramic grains are mixed and are subjected to heat treatment, all of the single crystal and the polycrystalline ceramic grains grow during the heat treatment, and increase in size, and according as the extent of growth becomes different according to a condition of the heat treatment, physical properties after the heat treatment may be controlled.

At this time, a temperature and time for the heat treatment from the condition of the heat treatment function as the best important variables, and additional variables, like an atmosphere for heat treatment (e.g., oxygen partial-pressure), a heating rate, pressure, and so on, are applied.

Accordingly, since according to the condition of the heat treatment, a grain growth rate, density, and so on are changed, piezoelectric and mechanical characteristics will become different.

However, although the optimum heat treatment condition may become different according to composition of the piezoelectric single crystal and the ceramic, preferably, with respect to the temperature and time for the heat treatment, the heat treatment is carried out at 900 to 1,300° C. for 1 to 100 hours.

Also, it is preferable that the heat treatment is carried out at 1 to 20° C./min of a heating rate, and pressure during the heat treatment may range from 1 to 50 MPa without being limited thereto.

Furthermore, the present invention may obtain a piezoelectric single crystal-polycrystalline ceramic composite in such a manner as to mix a perovskite type piezoelectric single crystal with polycrystalline ceramic grains at a specific grain size distribution ratio therebetween, and to carry out heat treatment.

The obtained piezoelectric single crystal-polycrystalline ceramic composite maintains a high piezoelectric charge constant and a low dielectric loss of the piezoelectric single crystal, thereby satisfying that a ratio [$d_{33}$/tan δ] between a piezoelectric charge constant $d_{33}$ (pC/N) and a dielectric loss tan δ (%) is 1,000 or more.

Also, since the piezoelectric single crystal-polycrystalline ceramic composite obtained through the present invention shows that the high piezoelectric charge constant, and the low dielectric loss of the piezoelectric single crystal are maintained, and at the same time as this, a dielectric constant is not large in increasing width, it is satisfied that a ratio [($d_{33} \times g_{33}$)/tan δ] between a value resulting from multiplying the piezoelectric charge constant $d_{33}$ (pC/N) by a piezoelectric voltage constant $g_{33}$ ($10^{-3}$ Vm/N), and the dielectric loss tan δ (%) at the room temperature is 25,000 or more.

Also, the piezoelectric single crystal-polycrystalline ceramic composite obtained from the present invention satisfies the following:

(1) a dielectric constant at 30° C. is 3,000 or more;

(2) a piezoelectric Charge Constant $d_{33}$ at 30° C. is 1,200 pC/N or more; and (3) a phase transition temperature which is first shown at 30° C. or more is 80° C. or more.

Furthermore, the present invention provides dielectric and piezoelectric application components comprising the piezoelectric single crystal-polycrystalline ceramic composite having a high internal electric field ($E_i \geq 0.5$ to 1.0 kV/cm) simultaneously with a high dielectric constant ($K_3{}^T \geq 3,000$), a high piezoelectric charge constant ($d_{33} \geq 1,200$ pC/N), and a high coercive electric field ($E_c \geq 3$ to 4 kV/cm) as a result of including single crystals having a perovskite type structure.

Specifically, examples of the piezoelectric application components include ultrasonic transducers (ultrasonographs for medical treatment, transducers for sound navigation ranging (SONAR), transducers for non-destructive inspection, ultrasonic washers, ultrasonic motors, etc.), piezoelectric actuators ($d_{33}$ type actuators, $d_{31}$ type actuators, dis type actuators, piezoelectric actuators intended for controlling minute positions, piezoelectric pumps, piezoelectric valves, and piezoelectric speakers, bimorph type actuators, and multiplayer actuators, etc.), piezoelectric sensors (piezoelectric G-meters, etc.), piezoelectric polymer composites (piezoelectric single crystal-polycrystalline ceramic composites, and composites of polymers and the like), and so on.

Also, examples of the dielectric application components include capacitors having a high degree of efficiency, infrared sensors, dielectric filters, electric field-generating transducers, and electric field and vibration-generating transducers.

MODE FOR CARRYING OUT THE INVENTION

Hereinafter, the present invention is described in more detail on the basis of the examples.

The present examples are intended for describing the present invention more specifically, and the scope of the present invention should not be construed as being limited to these examples.

<Example 1> Production of a Piezoelectric Single Crystal-Polycrystalline Ceramic Composite, and Evaluation on Characteristics 1

A piezoelectric single crystal of composition of $[Pb_{0.965}Sr_{0.02}La_{0.01}][(Mg_{1/3}Nb_{2/3})_{0.4}Zr_{0.25}Ti_{0.35}]O_3$ was produced using a solid phase single crystal growth method. Also, an excess of quantity of MgO was added in a synthetic process of powder so that a second phase of MgO, and a pore reinforcement phase were included in a range of 2 vol % inside of the produced single crystal. At this time, as a result of evaluating the characteristics of a piezoelectric charge constant, a dielectric constant, and a dielectric loss of (001) the piezoelectric single crystal produced, the piezoelectric charge constant $d_{33}$ was 2,650 pC/N, the dielectric constant was 8,773, and the dielectric loss tan $\delta$ was 0.5%.

The produced piezoelectric single crystal of the composition of $[Pb_{0.965}Sr_{0.02}La_{0.01}][(Mg_{1/3}Nb_{2/3})_{0.4}Zr_{0.25}Ti_{0.35}]O_3$ was cut in a small size, and then was consecutively crushed through a ball milling process. Grains of the piezo-electric single crystal crushed finally were sorted according to each size through a sieving process. A condition and time required for the ball milling process, and a sieving condition were controlled, so piezoelectric single crystal grains having a size ranging from several tens of micrometers to several millimeters were produced.

Figure 2:
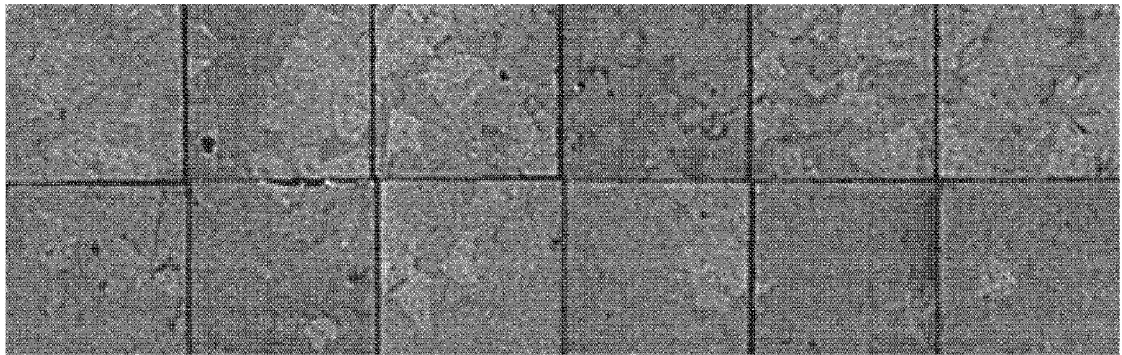
FIG. 2 shows piezoelectric single crystal-polycrystalline ceramic composites produced according to changes in size and volume fraction from Example 1 of the present invention.
Figure 3:
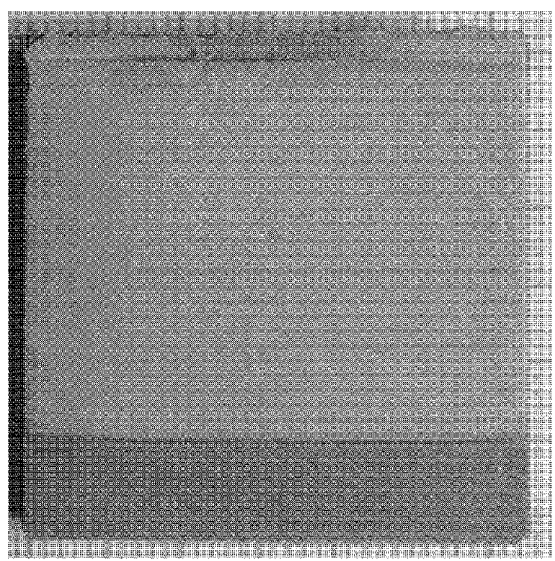
FIG. 3 shows a piezoelectric single crystal of $[Pb_{0.965}Sr_{0.02}Sm_{0.01}][(Mg_{1/3}Nb_{2/3})_{0.25} \quad (Ni_{1/3}Nb_{2/3})_{0.10} Zr_{0.30} Ti_{0.35}]O_3$ which is included in a piezoelectric single crystal-polycrystalline ceramic composite according to Example 2 of the present invention.
Figure 4:
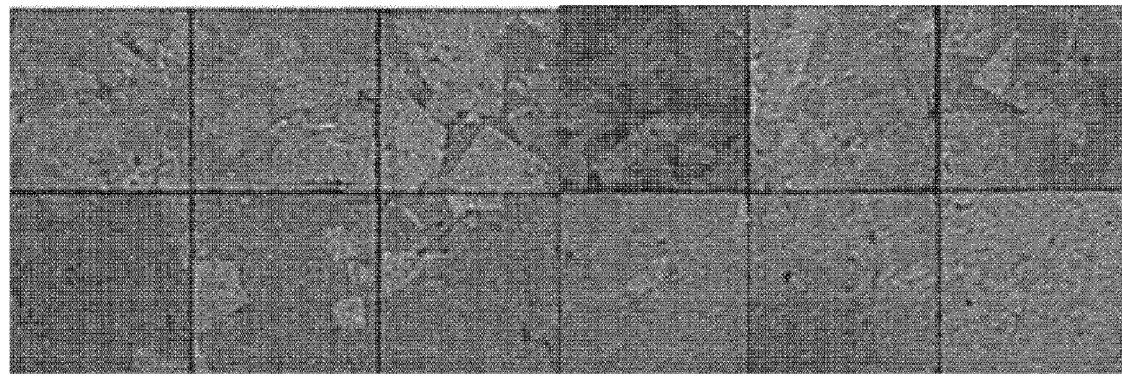
FIG. 4 shows piezoelectric single crystal-polycrystalline ceramic composites produced according to changes in size and volume fraction from Example 2 of the present invention.

The piezoelectric single crystal grains produced above, and calcined ceramic powder having ~1 μm of a grain size were mixed, molded, and sintered so that the piezoelectric single crystal-polycrystalline ceramic composite was finally produced. Volume of the piezoelectric single crystal was adjusted in the step of mixing the piezoelectric single crystal grains, and the calcined ceramic powder, and thus, as shown in FIG. 2, single crystal-polycrystalline ceramic composites having various kinds of volume fraction were produced.

<Example 2> Production of a Piezoelectric Single Crystal-Polycrystalline Ceramic Composite, and Evaluation on Characteristics 1

A piezoelectric single crystal of composition of $[Pb_{0.965}Sr_{0.02}La_{0.01}][(Mg_{1/3}Nb_{2/3})_{0.4}Zr_{0.25}Ti_{0.35}]O_3$ was produced using a solid phase single crystal growth method. Also, Pores of a matrix phase of a polycrystal were captured inside of the single crystal, so the produced single crystal included about 1.5 vol % of a pore reinforcement phase. The produced piezoelectric single crystal showed that a piezo-electric charge constant $d_{33}$ was 4,457 pC/N, a dielectric constant was 14,678, and a dielectric loss tan $\delta$ was 1.0%.

Piezoelectric single crystal grains, and a piezoelectric single crystal-polycrystalline ceramic composite were pro-duced by the same processes as those shown in said Example 1 except the fact that the piezoelectric single crystal of the composition of $[Pb_{0.965}Sr_{0.02}Sm_{0.01}][(Mg_{1/3}Nb_{2/3})_{0.25}(Ni_{1/3}Nb_{2/3})_{0.10}Zr_{0.30}Ti_{0.35}]O_3$ produced as described above was used.

With respect to the produced piezoelectric single crystal-polycrystalline ceramic composite, a Zr content shown in polycrystalline ceramic was adjusted to be lower than that shown in the piezoelectric single crystal. At this time, in case that the Zr content was low, since a sintering temperature of the polycrystalline ceramic could decrease, this is advanta-geous in that the piezoelectric single crystal was subjected to heat treatment at a lower temperature so that a chemical reaction among the piezoelectric single crystal and polycrys-talline ceramic grains could be minimized, and a thermal impact and so on occurring from the heat treatment process could be minimized.

<Experimental Example 1> Evaluation on Dielectric and Piezoelectric Characteristics 1

Among the piezoelectric single crystal-polycrystalline ceramic composites produced in said Example 1, with respect to the composite in which a piezoelectric single crystal grain having an average grain size of ~300 μm and polycrystalline grains having an average grain size of ~10 μm were mixed, molded and sintered, each change in a piezoelectric charge constant $d_{33}$ (pC/N), a piezoelectric voltage constant $g_{33}$ (mVm/V), and a dielectric loss tan $\delta$ (%) according to volume fraction was measured as described in Table 1 below.

TABLE 1

| Volume Fraction [%] | Average Size of Single Crystal/ Average Size of Polycrystal | Piezoelec-tric Charge Constant $[d_{33}$ (p C/N)] | Piezoelec-tric Voltage Constant $[g_{33}$ (mVm/ V] | Dielectric Loss [tan $\delta$ (%)] | $d_{33}/$ tan $\delta$ | $(d_{33} \times g_{33})/$ tan $\delta$ |
|---|---|---|---|---|---|---|
| 0 | — | 640 | 18 | 2.2 | 291 | 5,236 |
| 10 | 30 | 670 | 17 | 2.7 | 248 | 4,219 |
| 20 | 30 | 860 | 22 | 2.5 | 344 | 7,568 |
| 30 | 30 | 1,450 | 29 | 1.4 | 1,036 | 30,036 |
| 40 | 30 | 1,520 | 28 | 1.2 | 1,267 | 35,467 |
| 50 | 30 | 1,600 | 33 | 1.3 | 1,231 | 40,615 |
| 60 | 30 | 1,650 | 35 | 1.0 | 1,650 | 57,750 |
| 70 | 30 | 1,640 | 28 | 1.1 | 1,491 | 41,745 |
| 80 | 30 | 1,470 | 29 | 1.3 | 1,131 | 32,792 |
| 90 | 30 | 730 | 14 | 1.8 | 406 | 5,678 |
| 100 | — | — | — | — | — | — |

Among the single crystal-polycrystalline ceramic composites shown in said Table 1, with respect to the composite which was produced by mixing of a piezoelectric single crystal having 70% volume fraction, and polycrystalline grains having an average grain size of ~10 μm, each change in a piezoelectric charge constant $d_{33}$ (pC/N), a piezoelectric voltage constant $g_{33}$ (mVm/V), and a dielectric loss tan δ (%) according to a size ratio of the single crystal was measured as described in Table 2 below.

TABLE 2

| Size of Single Crystal [μm] | Average Size of Single Crystal/ Average Size of Polycrystal | Piezoelec-tric Charge Constant [$d_{33}$ (p C/N)] | Piezoelec-tric Voltage Constant [$g_{33}$ (mVm/ V] | Dielectric Loss [tan δ (%)] | $d_{33}$/ tan δ | ($d_{33}$ × $g_{33}$)/ tan δ |
|---|---|---|---|---|---|---|
| 100 | 10 | 820 | 18 | 2.2 | 373 | 6,709 |
| 200 | 20 | 1,380 | 29 | 1.2 | 1,150 | 33,350 |
| 300 | 30 | 1,640 | 28 | 1.1 | 1,491 | 41,745 |
| 500 | 50 | 1,520 | 30 | 1.4 | 1,086 | 32,571 |
| 700 | 70 | 1,480 | 27 | 1.2 | 1,233 | 33,300 |
| 900 | 90 | 1,420 | 28 | 1.3 | 1,092 | 30,585 |
| 1,000 | 100 | 1,370 | 24 | 1.3 | 1,054 | 25,292 |
| 1,200 | 120 | 450 | 16 | 1.9 | 237 | 3,789 |

As confirmed from the result, the single crystal-polycrystalline ceramic composite produced using the piezoelectric single crystal of the composition of $[Pb_{0.965}Sr_{0.02}La_{0.01}]$ $[(Mg_{1/3}Nb_{2/3})_{0.4}Zr_{0.25} Ti_{0.35}]O_3$ showed that a piezoelectric charge constant $d_{33}$, and a piezoelectric voltage constant $g_{33}$ were higher than those shown in existing piezoelectric polycrystalline ceramic, and at the same time as this, a dielectric loss tan δ was lower than that shown in existing piezoelectric polycrystalline ceramic. In particular, in case that a grain size and volume fraction of the single crystal, and a single crystal to polycrystal size ratio were specified, the piezoelectric characteristics of the composite were maximized ($d_{33}$>1,000, $d_{33}$/tan δ>1,000, and ($d_{33}$×$g_{33}$)/tan δ>30,000).

Also, in case that the volume ratio of the piezoelectric single crystal was less than 30% and was small, or the measurement specimen, current flow occurred at the time of poling, or piezoelectric characteristics tended to decrease suddenly.

<Experimental Example 2> Evaluation On Dielectric And Piezoelectric Characteristics 2

After an Ag paste electrode was applied onto both surfaces of the piezoelectric single crystal-polycrystalline ceramic composite produced in said Example 2, and poling was performed, evaluation on dielectric and piezoelectric characteristics was carried out.

Among the piezoelectric single crystal-polycrystalline ceramic composites produced as described above, with respect to the composite in which a piezoelectric single crystal having an average grain size of ~600 μm and polycrystalline grains having an average grain size of ~8 μm were mixed, molded and sintered, each change in a piezoelectric charge constant $d_{33}$ (pC/N), a piezoelectric voltage constant $g_{33}$ (mVm/V), and a dielectric loss tan δ (%) according to volume fraction [volume of the single crystal/ (the volume of the single crystal+volume of the polycrystal)] was measured as described in Table 3 below.

TABLE 3

| Volume Fraction [%] | Average Size of Single Crystal/ Average Size of Polycrystal | Piezoelec-tric Charge Constant [$d_{33}$ (p C/N)] | Piezoelec-tric Voltage Constant [$g_{33}$ (mVm/ V] | Dielectric Loss [tan δ (%)] | $d_{33}$/ tan δ | ($d_{33}$ × $g_{33}$)/ tan δ |
|---|---|---|---|---|---|---|
| 0 | — | 720 | 16 | 2.6 | 277 | 4,431 |
| 10 | 75 | 780 | 18 | 2.4 | 325 | 5,850 |
| 20 | 75 | 840 | 19 | 2.1 | 400 | 7,600 |
| 30 | 75 | 1,360 | 30 | 1.2 | 1,133 | 34,000 |
| 40 | 75 | 1,480 | 28 | 1.0 | 1,480 | 41,440 |
| 50 | 75 | 1,550 | 32 | 1.2 | 1,292 | 41,333 |
| 60 | 75 | 1,720 | 34 | 1.0 | 1,720 | 58,480 |
| 70 | 75 | 1,710 | 33 | 1.3 | 1,315 | 43,408 |
| 80 | 75 | 1,580 | 30 | 1.4 | 1,129 | 33,857 |
| 90 | 75 | 910 | 18 | 2.4 | 379 | 6,825 |
| 100 | — | — | — | — | — | — | volume ratio exceeded 80%, piezoelectric and mechanical characteristics improved beyond those shown in the polycrystal couldn't be obtained.

In particular, in case that the volume ratio of the single crystal exceeded 80%, since sintering density of the composite was low, and the composite was easily broken at the time of mechanical processing, it was impossible to make a Among the single crystal-polycrystalline ceramic composites shown in said Table 3, with respect to the composite which was produced by mixing of a piezoelectric single crystal having 60% volume fraction, and polycrystalline grains having an average grain size of ~8 μm, each change in a piezoelectric charge constant $d_{33}$ (pC/N), a piezoelectric voltage constant $g_{33}$ (mVm/V), and a dielectric loss tan δ

(%) according to a size ratio of the single crystal was measured as described in Table 4 below.

TABLE 4

| Size of Single Crystal [μm] | Average Size of Single Crystal/ Average Size of Polycrystal | Piezoelectric Charge Constant [$d_{33}$ (p C/N)] | Piezoelectric Voltage Constant [$g_{33}$ (mVm/V)] | Dielectric Loss [tan δ (%)] | $d_{33}$/ tan δ | ($d_{33}$ × $g_{33}$)/ tan δ |
|---|---|---|---|---|---|---|
| 100 | 12.5 | 790 | 19 | 2.2 | 359 | 6,823 |
| 200 | 25 | 1,460 | 28 | 1.3 | 1,123 | 31,446 |
| 300 | 37.5 | 1,580 | 31 | 1.2 | 1,317 | 40,817 |
| 400 | 50 | 1,650 | 29 | 1.0 | 1,650 | 47,850 |
| 500 | 62.5 | 1,830 | 30 | 1.1 | 1,664 | 49,909 |
| 600 | 75 | 1,720 | 34 | 1.0 | 1,720 | 58,480 |
| 700 | 87.5 | 1,680 | 34 | 1.3 | 1,292 | 43,938 |
| 800 | 100 | 1,510 | 30 | 1.4 | 1,079 | 32,357 |
| 900 | 112.5 | 920 | 20 | 2.1 | 438 | 8,762 |

As confirmed from the result, the single crystal-polycrystalline ceramic composite produced using the piezoelectric single crystal of the composition of [$Pb_{0.965}Sr_{0.02}Sm_{0.01}$][$(Mg_{1/3}Nb_{2/3})_{0.25}(Ni_{1/3}Nb_{2/3})_{0.10}Zr_{0.30}Ti_{0.35}$]$O_3$ showed that the piezoelectric charge constant $d_{33}$, and the piezoelectric voltage constant $g_{33}$ were higher than those shown in existing piezoelectric polycrystalline ceramic, and at the same time as this, the dielectric loss tan δ was lower than that shown in existing piezoelectric polycrystalline ceramic.

In particular, in case that a size and volume fraction of the single crystal grains, and a single crystal to polycrystal size ratio were specified, the piezoelectric characteristics of the composite were maximized ($d_{33}$>1,000, $d_{33}$/tan δ>1,000, and ($d_{33}$×$g_{33}$)/tan δ>30,000). In case that a volume ratio of the piezoelectric single crystal was too small (less than 30%) or too large (exceeding 80%), piezoelectric and mechanical characteristics improved beyond those shown in the polycrystal couldn't be obtained. In particular, in case that the volume ratio of the single crystal exceeded 80%, since sintering density of the composite was low, the composite was easily broken at the time of mechanical processing, and thus it was impossible to make a measurement specimen, current flow occurred at the time of poling, or piezoelectric characteristics tended to decrease suddenly.

<Experimental Example 3> Observations on Each Change in Dielectric Characteristic According to Temperature, and Phase Transition Phenomenon Piezoelectric single crystals of each composition of PMN-PT, and [$Pb_{0.965}Sr_{0.02}La_{0.01}$][$(Mg_{1/3}Nb_{2/3})_{0.4}Zr_{0.25}Ti_{0.35}$]$O_3$ were produced by a solid phase single crystal growth method. Also, the piezoelectric single crystal-polycrystalline ceramic composite produced in said Example 1 was selected as a sample, and with respect to the piezoelectric single crystals, and the piezoelectric single crystal-polycrystalline ceramic composite, each change in dielectric characteristic according to a temperature, and a phase transition phenomenon were observed.

Figure 5:
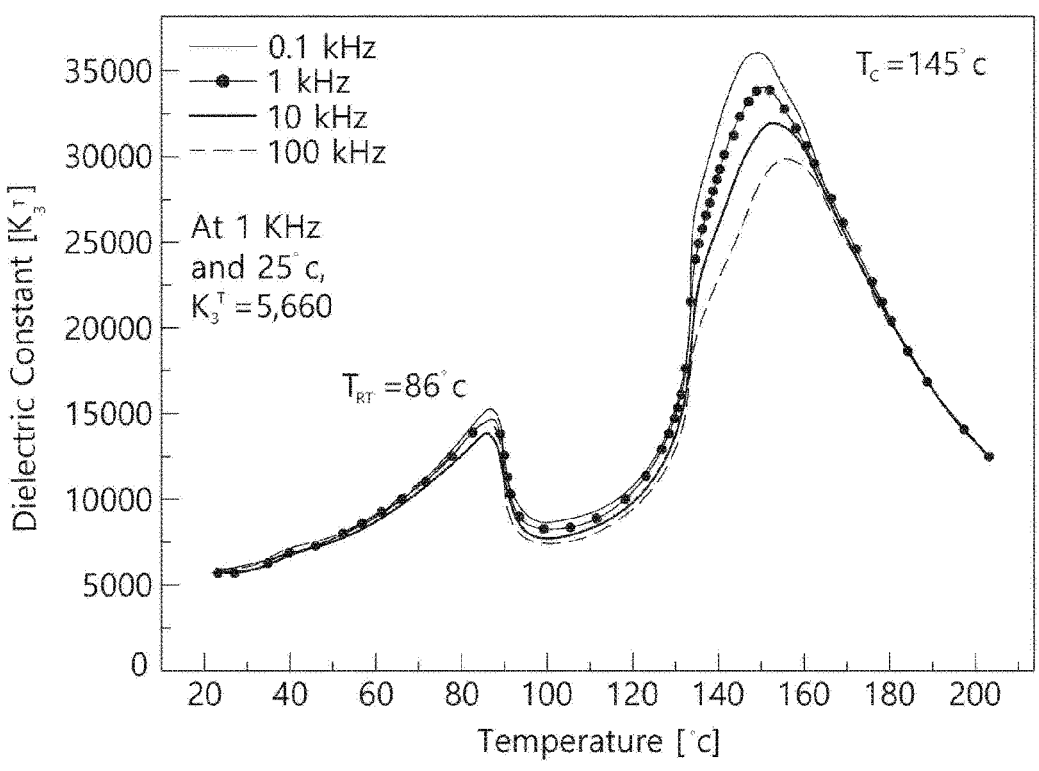
FIG. 5 shows a change in dielectric characteristic, and a result derived from a phase transition phenomenon according to each temperature of a piezoelectric single crystal of PMN-PT produced by a solid phase single crystal growth method.

FIG. 5 shows a result of observing each change in dielectric characteristic according to a temperature, and a phase transition phenomenon with respect to the piezoelectric single crystal of PMN-PT produced by the solid phase single crystal growth method, wherein a dielectric constant of the PMN-PT single crystal at a curie temperature $T_E$ was higher than at a phase transition temperature $T_{RT}$ between ferroelectric phases.

Figure 6:
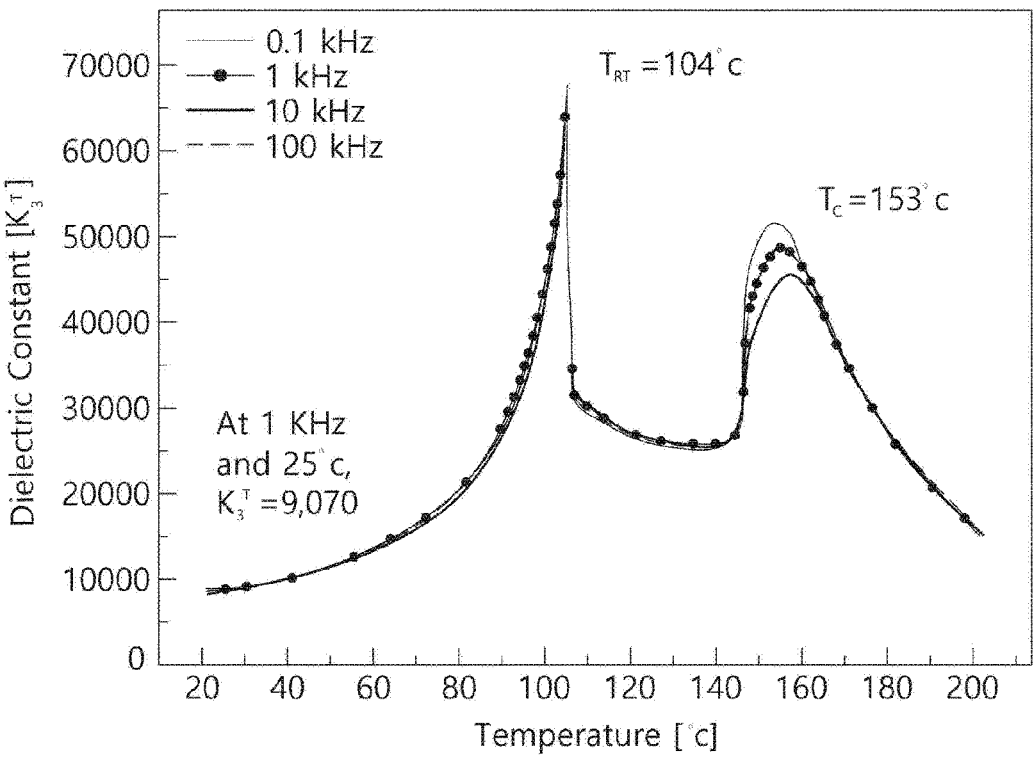
FIG. 6 shows a change in dielectric characteristic, and a result derived from a phase transition phenomenon according to each temperature of the piezoelectric single crystal of $[Pb_{0.965}Sr_{0.02} \ La_{0.01}][(Mg_{1/3}Nb_{2/3})_{0.4}Zr_{0.25} \ Ti_{0.35}]O_3$ produced by a solid phase single crystal growth method.

FIG. 6 shows a result of observing each change in dielectric characteristic according to a temperature, and a phase transition phenomenon with respect to the piezoelectric single crystal of [$Pb_{0.965}Sr_{0.02}La_{0.01}$][$(Mg_{1/3}Nb_{2/3})_{0.4}Zr_{0.25}Ti_{0.35}$]$O_3$ produced by the solid phase single crystal growth method, wherein a dielectric constant shown at a curie temperature TC was confirmed to be higher than that shown at a phase transition temperature $T_{RT}$ between ferroelectric phases.

Figure 7:
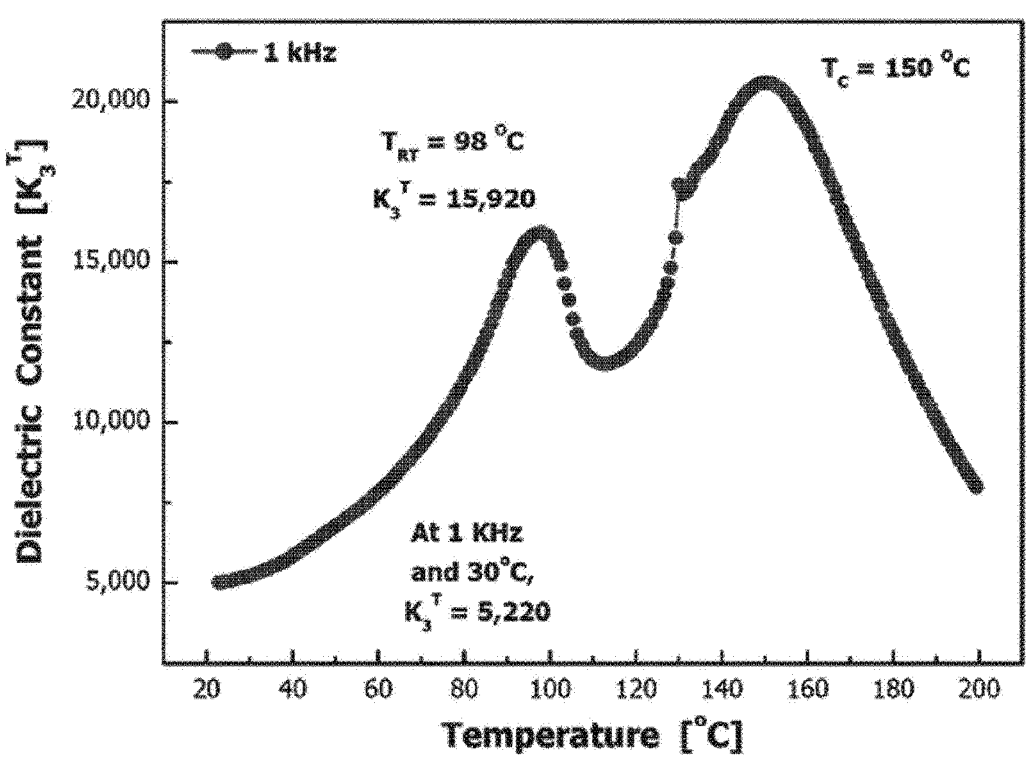
FIG. 7 shows a result derived from observations on a change in dielectric characteristic, and a phase transition phenomenon according to each temperature of the piezoelectric single-polycrystalline ceramic composite produced in Example 1 of the present invention.

As confirmed through FIG. 7, in case of the piezoelectric single crystal-polycrystalline ceramic composite produced in Example 1 using the piezoelectric single crystal of [$Pb_{0.965}Sr_{0.02}La_{0.01}$][$(Mg_{1/3}Nb_{2/3})_{0.4}Zr_{0.25}$ $Ti_{0.35}$]$O_3$, a dielectric constant shown at a phase transition temperature was high largely compared with that shown at the room temperature [the dielectric constant (@ $T_{RT}$)>3×the dielectric constant (@ 30° C.)], and the characteristic shown at the room temperature of the piezoelectric single crystal-polycrystalline ceramic composite was largely improved beyond that shown at the room temperature in case that a general single crystal of PMN-PT was used.

As confirmed from the result, similarly to the piezoelectric single crystal, the piezoelectric single crystal-polycrystalline ceramic composite showed that a phase transition between ferroelectric phases (a rhombohedral phase, a tetragonal phase, and so on) was observed at a curie temperature $T_C$ or below; and the dielectric constant $K_3{}^T$ shown at the phase transition temperature was more than 3 times higher than the $K_3{}^T$ at the room temperature.

Accordingly, more preferably, when the piezoelectric single crystal showing the high dielectric constant at the phase transition temperature between the ferroelectric phases was used, it was effective to improve piezoelectric characteristics of the piezoelectric single crystal-polycrystalline ceramic composite.

<Experimental Example 4> Evaluation on Mechanical Physical Properties

With respect to the samples of the piezoelectric single crystal-polycrystalline ceramic composite produced in said Example 1 using the piezoelectric single crystal of the composition of [$Pb_{0.965}Sr_{0.02}La_{0.01}$][$(Mg_{1/3}Nb_{2/3})_{0.4}Zr_{0.25}Ti_{0.35}$]$O_3$ produced by the solid phase single crystal growth method, they were compared and evaluated with respect to mechanical characteristics thereof, like fracture strength, fracture toughness, and so on. At this time, values of the fracture strength were measured by a method of measuring four-point bending strength according to the ASTM method.

Among the piezoelectric single crystal-polycrystalline ceramic composites of Example 1 presented in Table 1 above, two composites each showing 40% volume fraction and 60% volume fraction were selected as specimens, and thus they were compared with a specimen of (001) the piezoelectric single crystal with respect to fracture strength thereof. A result thereof was described in Table 5 below.

TABLE 5

| Kind of Specimen | Volume Fraction [%] | Average Size of Single Crystal/ Average Size of Polycrystal | Fracture Strength [MPa] | Fracture Toughness [MPa·m$^{1/2}$] |
|---|---|---|---|---|
| Composite | 40 | 30 | 112 | 1.15 |
| Composite | 60 | 30 | 92 | 094 |
| Single Crystal | 100 | — | 56 | 0.45 |

Also, among the piezoelectric single crystal-polycrystalline ceramic composites of Example 1 presented in Table 2 above, two composites each showing single crystal sizes of 200 μm and 500 μm were selected as specimens, and thus they were compared with a specimen of (001) the piezoelectric single crystal with respect to fracture strength thereof. A result thereof was described in Table 6 below.

TABLE 6

| Kind of Specimen | Volume Fraction [%] | Average Size of Single Crystal/ Average Size of Polycrystal | Fracture Strength [MPa] | Fracture Toughness [MPa·m$^{1/2}$] |
|---|---|---|---|---|
| Composite | 200 | 20 | 104 | 1.02 |
| Composite | 500 | 50 | 82 | 0.81 |
| Single Crystal | — | — | 56 | 0.45 |

As confirmed from the result, the piezoelectric single crystal-polycrystalline ceramic composites had fracture strength and fracture toughness more than two times higher than those of the piezoelectric single crystal of $[Pb_{0.965}Sr_{0.02}La_{0.01}][(Mg_{1/3}Nb_{2/3})_{0.4}Zr_{0.25}Ti_{0.35}]O_3$, and were similar to those of general piezoelectric polycrystalline ceramic.

Accordingly, the fracture strength and the fracture toughness of the piezoelectric single crystal-polycrystalline ceramic composites produced in the present experimental example were confirmed to increase about two times in comparison of those of the piezoelectric single crystal.

Also, matrix phases of a polycrystal surrounding the single crystal from each of the piezoelectric single crystal-polycrystalline ceramic composites had mechanical characteristic higher than those of the single crystal, and protected the single crystal from a mechanical impact, and as a result, mechanical performance of the composites were significantly improved.

As described above, as the single crystal showing the excellent piezoelectric characteristic, and the polycrystalline ceramic having the excellent mechanical characteristic were mixed, the composites showing all of two excellent characteristics resulting from improving a mechanical brittleness characteristic simultaneously with maintaining a high piezoelectric characteristic could be produced.

As previously described, although the present invention has been described in detail on the basis of only the detailed examples as described, it should be obvious that various variations and modifications can be made by those having ordinary skill in the art within the scope of the technical ideas of the present invention, and it should be natural that these variations and modifications belong into the scope of the accompanying claims.

What is claimed is:

1. A piezoelectric single crystal-polycrystalline ceramic composite comprising:

a mixture of a piezoelectric single crystal having a perovskite type structure ($[A][B]O_3$), and polycrystalline ceramic grains, wherein the composite satisfies the following:

an average grain size distribution a of the piezoelectric single crystal is 100 to 1,000 μm;

an average grain size distribution b of the polycrystalline ceramic grains is 2 to 20 μm; and a ratio a/b between the grain size distributions is 20 to 100, and wherein the piezoelectric single crystal-polycrystalline ceramic composite has a ratio [$d_{33}$/tan δ] of 1,000 or more where $d_{33}$ (pC/N) is a piezoelectric charge constant and tan δ (%) is a dielectric loss at the room temperature.

2. The composite of claim 1, wherein the piezoelectric single crystal is contained in a range of 30 to 80 vol %.

3. The composite of claim 1, wherein under a condition of the room temperature, the piezoelectric single crystal-polycrystalline ceramic composite has (1) a dielectric constant $K_3^T$ of 3,000 or more, (2) a piezoelectric charge constant $d_{33}$ of 1,200 pC/N or more, and (3) a phase transition temperature of 80° C. or more.

4. The composite of claim 1, wherein the piezoelectric single crystal-polycrystalline ceramic composite has a phase transition between ferroelectric phases exists at a curie temperature $T_C$ or below, a dielectric constant $K_3^T$ of the composite at the phase transition temperature between the ferroelectric phases is more than three times higher than the $K_3^T$ at the room temperature.

5. The composite of claim 1, wherein the piezoelectric single crystal-polycrystalline ceramic composite has a ratio [$(d_{33} \times g_{33})$/tan δ] of 25,000 or more where $g_{33}$ ($10^{-3}$ Vm/N) is a piezoelectric voltage constant.

6. The composite of claim 1, wherein the piezoelectric single crystal-polycrystalline ceramic composite further comprises a vacant space inside of the composite that is partially or completely filled with a polymer.

7. The composite of claim 1, wherein the piezoelectric single crystal is represented by Chemical Formula 1 below:

$$[A_{1-(a+1.5b)}B_aC_b][(MN)_{1-x-y}(L)_yTi_x]O_{3-z} \qquad \text{Chemical Formula 1}$$

in said formula, A represents Pb or Ba,

B represents at least one or more elements selected from a group consisting of Ba, Ca, Co, Fe, Ni, Sn, and Sr, C represents one or more elements selected from a group consisting of Co, Fe, Bi, La, Ce, Pr, Nd, Pm, Sm, Eu, Gd, Tb, Dy, Ho, Er, Tm, Yb, and Lu, L represents a single form composed of one selected from Zr or Hf, or a mixed form thereof, M represents at least one or more element selected from a group consisting of Ce, Co, Fe, In, Mg, Mn, Ni, Sc, Yb, and Zn, N represents at least one or more elements selected from a group consisting of Nb, Sb, Ta, and W, and a, b, x, y, and z represent $0 < a \le 0.10$, $0 < b \le 0.05$, $0.05 \le x \le 0.58$, $0.05 \le y \le 0.62$, and $0 \le z \le 0.02$, respectively.

8. The composite of claim 7, wherein in said formula, a and b represent $0.01 \le a \le 0.10$ and $0.01 \le b \le 0.05$, respectively.

9. The composite of claim 7, wherein in said formula, a and b satisfy a/b>2.

10. The composite of claim 7, wherein in said formula, x and y represent 0.10≤x≤0.58 and 0.10≤y≤0.62, respectively.

11. The composite of claim 7, wherein when L represents a mixture of Zr and Hf, the piezoelectric single crystal is expressed by Chemical Formula 2 below:

$$[A_{1-(a+1.5b)}B_aC_b][(MN)_{1-x-y}(Zr_{1-w},Hf_w)_yTi_x]O_3 \quad \text{Chemical Formula 2}$$

in said formulae, A, B, C, M, N, a, b, x, y, and z are identical with those shown in said Chemical Formula 1, and w represents 0.01≤w≤0.20.

12. A method of manufacturing a piezoelectric single crystal-polycrystalline ceramic composite, the method comprising:

preparing single crystal grains a by crushing a piezoelectric single crystal having a perovskite type structure ([A][B]O_3) in 50 μm or more;

preparing polycrystal powder grains b having an average grain size distribution of 0.1 to 5 μm, thereby carrying out mixing and heat treatment so that a ratio between the grain size distributions a/b reaches 20 or more; and growing the piezoelectric single crystal through the heat treatment so that a grain size of the piezoelectric single crystal reaches 100 μm or more, wherein the ratio between the grain size distributions a/b after the heat treatment reaches 20 to 100, and wherein the piezoelectric single crystal is contained in a range of 30 to 80 vol % after the heat treatment.

13. The method of claim 12, wherein the piezoelectric single crystal is contained in a range of 80 vol % or below at the time of said mixing.

14. The method of claim 12, wherein an average grain size distribution a of the piezoelectric single crystal grown after the heat treatment is 100 to 1,000 μm, an average grain size distribution b of the polycrystalline grains grown after the heat treatment is 2 to 20 μm, and a ratio between the grain size distributions a/b is 20 to 100.

15. The method of claim 12, wherein the heat treatment is carried out at 900 to 1,300° C. for 1 to 100 hours.

16. The method of claim 12, wherein the heat treatment is carried out at a heating rate of 1 to 20° C./min.

17. A piezoelectric application component and a dielectric application component comprising the piezoelectric single crystal-polycrystalline ceramic composite according to claim 1.

18. The composite of claim 1, wherein the average grain size distribution a of the piezoelectric single crystal is 200 to 1,000 μm.

19. A piezoelectric single crystal-polycrystalline ceramic composite comprising:

a mixture of a piezoelectric single crystal having a perovskite type structure ([A][B]O_3), and polycrystalline ceramic grains, wherein the composite satisfies the following:

an average grain size distribution a of the piezoelectric single crystal is 100 to 1,000 μm;

an average grain size distribution b of the polycrystalline ceramic grains is 2 to 20 μm; and a ratio a/b between the grain size distributions is 20 to 100, wherein under a condition of the room temperature, the piezoelectric single crystal-polycrystalline ceramic composite has (1) a dielectric constant $K_3^T$ of 3,000 or more, (2) a piezoelectric charge constant $d_{33}$ of 1,200 pC/N or more, and (3) a phase transition temperature of 80° C. or more.

* * * * *